United States Patent [19]
Chan et al.

[11] Patent Number: 5,841,784
[45] Date of Patent: *Nov. 24, 1998

[54] TESTING AND REPAIR OF EMBEDDED MEMORY

[75] Inventors: Tsiu Chiu Chan, Carrollton; Lawrence P. Eng, Dallas, both of Tex.

[73] Assignee: STMicroelectronics, Inc., Carrollton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 626,540

[22] Filed: Apr. 2, 1996

[51] Int. Cl.⁶ ..................................... G06F 11/00
[52] U.S. Cl. ..................................... 371/21.1; 395/183.07
[58] Field of Search ............................... 371/21.1, 21, 5.1, 371/40.1, 27, 22.1, 22.5; 365/201, 189.03, 189.05, 230.02; 395/479, 183.07, 183.06

[56] References Cited

U.S. PATENT DOCUMENTS

| | | | |
|---|---|---|---|
| 3,961,251 | 6/1976 | Hurley et al. | 324/73 |
| 4,481,627 | 11/1984 | Beauchesne et al. | 371/21 |
| 4,811,306 | 3/1989 | Boning et al. | 365/200 |
| 4,860,260 | 8/1989 | Saito et al. | 365/200 |
| 5,254,940 | 10/1993 | Oke et al. | 324/158 |
| 5,309,446 | 5/1994 | Cline et al. | 365/201 |
| 5,410,544 | 4/1995 | Kreifels et al. | 371/18 |
| 5,471,431 | 11/1995 | McClure | 365/225.7 |
| 5,485,424 | 1/1996 | Kawamura | 365/200 |

*Primary Examiner*—Robert W. Beausoliel, Jr.
*Assistant Examiner*—Nadeem Iqbal
*Attorney, Agent, or Firm*—Theodore E. Galanthay; Lisa K. Jorgenson; Pete Thoma

[57] ABSTRACT

A method and circuits for coupling a memory embedded in an integrated circuit to interconnect pads during a memory test mode is disclosed. The integrated circuit contains a processor, an embedded memory and a switching circuit for: (1) temporary coupling the memory array and memory peripheral circuits, coupled to the processor during normal operation mode of the circuit, to the interconnect pads of the memory during a memory test mode; (2) and decoupling the interconnect pads from the memory array and peripheral circuits, after the memory is tested, and coupling the memory array and peripheral circuits to the processor.

2 Claims, 3 Drawing Sheets

TESTING AND REPAIR OF EMBEDDED MEMORY

CROSS-REFERENCE TO RELATED APPLICATIONS

This application contains text in common with pending U.S. patent application entitled "Testing and Repair of Embedded Memory" by Tsiu C. Chan and Lawrence P. Eng Ser. No. 08/626,499, which has and ownership as the present application, and to that extent is arguably related to the present application, which is incorporated herein by reference.

BACKGROUND AND SUMMARY OF THE INVENTION

The present invention relates to the field of electronic devices having embedded memory, and is more specifically directed to the testing and repairing of the embedded memory.

Embedded memory is memory that is embedded with a processor. The embedded memory can be the memory necessary for the core functionality of the processor, it can also be the data storage memory, where the data that the processor processes is stored. Many processors contain a small amount of memory, typically on the order of several kilo bits, which is typically arranged into memory registers and is necessary for the core functionality of the processor.

The data storage memory is much larger than the memory that is needed for the processor for its core functionality. Currently this memory is usually external memory, i.e. it is not embedded on the same integrated circuit that the processor is on because of the low yield of the process in manufacturing the circuit and the expense of testing and repairing the memory. A goal in the semiconductor industry is to increase the speed of the processor. One way to increase the speed of the processor is to embed the memory used for data storage into the processor.

When memory used for data storage is on a separate chip than the processor the two chips must be electrically coupled. The input/output pins of the processor are coupled to the input/output pins of the memory by external metal connections. This increases the amount of time it takes for the processor to read data out of the memory and write data into the memory. Embedding the memory into the processor reduces the amount of time the processor takes to access the memory. Additionally, since the memory now does not require the external input/output pins previously needed for coupling to the processor, the packaging cost of the memory is greatly reduced. Furthermore, the memory can now be specifically configured for the processor into which it is embedded. Embedding the memory in the processor also eliminates the need for the external metal connections, increasing the accuracy of the connections in the combined product.

For example, a standard memory device design can be embedded in the processor, with the memory array and peripheral circuits needed to operate the memory array coupled to the processor. Since most standard memory devices have input/output pads, the embedded memory would have the input/output pads but they would be disconnected from the memory array and memory peripheral circuits.

Both the memory and the processors are tested to ensure that they do not malfunction. Every cell in a memory is typically tested to ensure that there are no defective cells. A fatal defect in one memory cell makes the cell inoperable. If the cell is not replaced the entire memory device can malfunction. Therefore, a defective memory cell must either be replaced, or the entire chip discarded. When the memory is embedded in a processor the cost of discarding the chip increases.

As the component size is reduced and the density of components per unit area of a semiconductor device is increased, the costs of the device decreases while its speed increases. However, as the size of components decreases and their density increases the size of a defect that can cause failure also shrinks. Additionally, as the speed with which processors process data increases, the amount of data that can be made available to the processors also increases, usually by increasing the size of the memory for storing data. As the size of and total number of components in a memory device continues to increase, so does the cost of each memory device, and therefore the cost of each non-usable memory device.

Redundant columns and/or rows are often used in memory devices to prevent an isolated defect from destroying the entire device. The decision on whether to use redundant columns and/or rows is based on balancing the additional die space needed for the redundancy architecture and the yield of the manufacturing process if redundancy is not used. If the yield is high enough, it is cheaper to discard the few memories with defective cell than add the redundancy architecture to each memory. If the yield is not sufficiently high, the redundancy architecture can greatly decrease the yield loss in these memory devices by replacing a column or row containing a defect in one of its memory cells with a redundant column or row. This can save a memory device that would otherwise have been unusable.

The defects in the memory cells are discovered in initial testing, and the redundant columns or rows can then be activated to replace the columns or rows containing defective cells. Extensive testing is performed on the memory to determine which if any of the memory cells are defective. The test equipment for testing memories is coupled to the input/output pads of the memory. When a memory is embedded into the processor this is usually is not possible. The memory is coupled to the processor and not to the input/output pads. Thus the memory must be tested through the processor.

Processors are also tested to ensure that they function properly. The test equipment for testing processors is coupled to the input/output pads of the processor.

A problem in the prior art is that the cost of testing a chip increases when a memory is embedded in a processor. This is especially true for the testing required to discover which memory cell is defective. To find exactly which memory cell is defective the memory must be extensively tested. In modern technology, embedded memory is tested through the processor, using the input/output pads of the processor since the memory is not coupled to its own input/output pads. The testing equipment for the processors is at least several times more expensive than comparable testing equipment for memories. Both the memory and the processor must now be tested on the processor testing equipment, increasing the amount of time each chip is required to spend on the processor testing equipment by the amount of time it takes to perform the memory tests. Therefore, either:

(1) more very expensive processor testing equipment must be used to test both the processor and the memories which can now only be tested through the processor, drastically increasing the cost of each chip; or (2) the cycle time of producing a given number of processors containing embedded memories will be much larger than for processors without embedded memories.

Both of these increase the cost of the chip, whether the memory will be repaired or not, since either way each memory cell must still be tested. Although when the memory will also be repaired the test time and therefore the cost is even greater. When the memory is small this increase is small. However, when the memory is the size of a memory used for data storage, which can range from hundreds of kilo bits to many Mega bits or more, this increase is prohibitively expensive. This makes the cost of embedding memories for data storage into processor impractical despite all the advantages, described above, obtained from embedding the memory into the processor, and hinders the achievement of the long recognized goal to increase the speed with which the processor can access data.

SUMMARY OF THE INVENTION

The present application discloses a method and circuits for coupling an embedded memory to the memory's interconnect pads through a switching circuit during a memory test mode. This allows the memory to be coupled through the interconnect pads to memory test equipment, and to be tested on memory test equipment, instead of being tested on the processor test equipment. In the normal operation mode of the circuit, the memory is coupled to the processor through the switching circuit. The memory is decoupled from the processor in a memory test mode.

A significant advantage of the present invention is that the majority of the memory testing can be performed using the less expensive memory test equipment instead of the more expensive processor test equipment.

Another advantage of the present invention is a standard memory device can be used, which can save both critical time and effort in the chip design allowing the product to get to market faster.

Other advantages and objects of the invention will be apparent to those of ordinary skill in the art having reference to the following specification together with the drawings.

DETAILED DESCRIPTION OF THE PREFERRED EMBODIMENT

Figure 1:
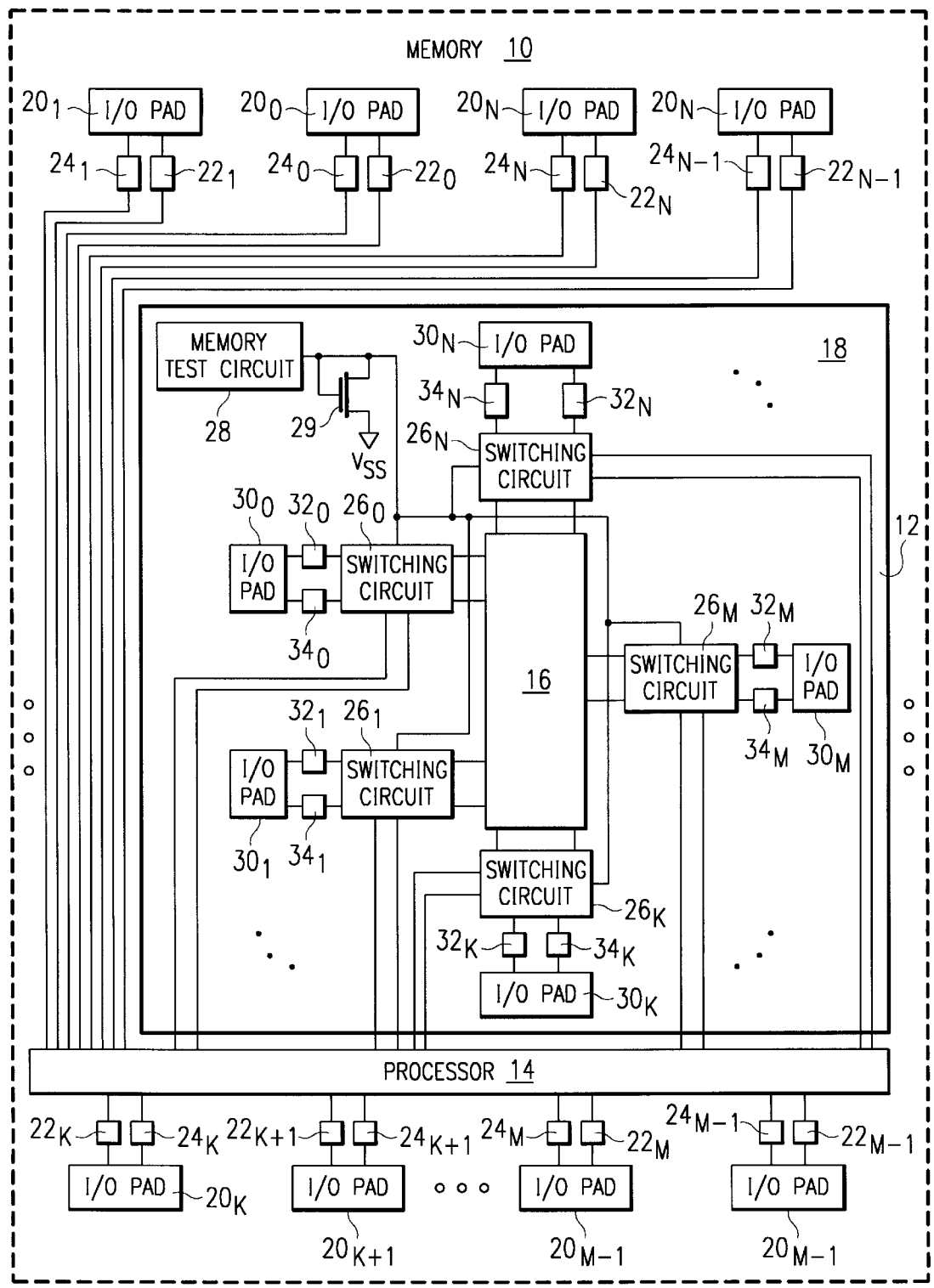
FIG. 1 is an electrical diagram, in block form, of an integrated circuit containing embedded memory according to an embodiment of the present invention.

FIG. 1 shows an integrated circuit 10 containing an embedded memory according to an embodiment of the present invention. Integrated circuit 10 contains a memory 12, a processor 14, and interconnect pads $20_0$, . . . $20_N$ coupled to the processor 14. In the current technology DRAMS are typically used for data storage, although any conventional memory can be used, such as SRAMs, which can be more compatible with the processor fabrication technology. Each of the interconnect pads $20_0$, . . . $20_N$ can be an input/output pad, just an input pad, or just an output pad depending on the functionality of the integrated circuit's 10 component that the pad is coupled to. Input circuits $22_0$, . . . $22_N$ are coupled to the input/output pads and to input pads, and output circuit $24_0$, . . . $24_N$ are coupled to the input/output pads and to output pads.

The memory 12 contains the memory array and the peripheral circuits needed to operate the memory array (hereinafter memory array 16), and memory interconnect pads $30_0$, . . . $30_N$, which are located in the periphery 18 of the memory 12. Memory 12 can be a preexisting chip design. Using a preexisting chip design will save critical design time in the design of the integrated circuit 10.

Like the interconnect pads $20_0$, . . . $2_N$ memory interconnect pads $30_0$, . . . $30_N$ can be input/output pads, just input pads, or just output pads. Input circuits $32_0$, . . . $32_N$ are coupled to the input/output pads and to input pads, and output circuit $34_0$, . . . $34_N$ are coupled to the input/output pads and to output pads. Switching circuits $26_0$, . . . $26_N$ are coupled to the memory interconnect pads $30_0$, . . . $30_N$, to the memory array 16, and to the processor 14. Electrostatic-discharge protection components can be coupled to both the interconnect pads $20_0$, . . . $20_N$ and the memory interconnect pads $30_0$, . . . $30_N$.

The switching circuits $26_0$, . . . $26_N$ are controlled by a memory test circuit 28. The output of the memory test circuit is coupled to the control input of each of the switching circuits. The memory test circuit can be located in the periphery 18 of the memory 12 as shown in FIG. 1, or anywhere on the integrated circuit 10. In the preferred embodiment, the memory test circuit 28 is simply a memory test pad (hereinafter memory test pad 28), although any conventional memory test circuit that is capable of producing two distinguishable logic states at its output can be used. A current limiting device 29 is coupled between the output of the memory test pad 28 and the control inputs of the switching circuits $26_0$, . . . $26_N$. The current limiting device 29 can be any device that reduces or eliminates the power dissipation when the memory test pad is low. The current limiting device 29 can be any device that produces a large resistance, and is preferably an n-channel transistor (hereinafter transistor 29) whose length is much greater than its width. The length to width ratio of transistor 29 in the preferred embodiment is on the order of 100 to 1.

The switching circuits $26_0$, . . . $26_N$ allow the memory array 16 to be coupled to the memory interconnect pads $30_0$, . . . $30_N$ or to the processor 14. There must be enough switching circuits $26_0$, . . . $26_N$ such that enough memory interconnect pads $30_0$, . . . $30_N$ can be coupled to the memory array 16 to allow the memory array 16 to be coupled to memory test equipment and tested. In the integrated circuit 10 shown in FIG. 1 all of the memory interconnect pads $30_0$, . . . $30_N$ are coupled to a switching circuit $26_0$, . . . $26_N$, respectively. However, in alternative embodiments of the invention some memory interconnect pads $30_0$, . . . $30_N$ may remain disconnected from the memory array 12.

The memory array 16 is coupled to the input of each of the switching circuits $26_0$, . . . $26_N$. The processor 14 is coupled to the first output of each of the switching circuits $26_0$, . . . $26_N$. One of the memory interconnect pads $30_0$, . . . $30_N$ is coupled to the second output of each of the switching circuits $26_0$, . . . $26_N$, respectively.

In the normal operation of the circuit the memory array 16 is coupled to the processor 14 through the switching circuits $26_0, \ldots 26_N$ responsive to a first logic state on the memory test pad 28. The first logic state is preferably low since this does not require the memory test pad 28 to dissipate power during the normal operating mode of the integrated circuit 10, which it is in most of the time. When the circuit enters the normal operation mode memory array 16 is coupled to the processor 14. When the circuit 10 enters the normal operation mode from the memory test mode the memory is decoupled from the memory interconnect pads $30_0 \ldots 30_N$ and coupled to the processor 14. In the preferred embodiment of the invention this occurs simultaneously.

In a memory test mode, the logic state on the memory test pad 28 is high causing the switching circuits $26_0 \ldots 26_N$ to couple the memory array 16 to the memory interconnect pads $30_0 \ldots 30_N$ and to decouple the memory array 16 from the processor 14 if the memory array is coupled to the processor when the circuit enters the memory test mode. In the preferred embodiment of the invention this occurs simultaneously when the circuit enters the memory test mode. Coupling the memory array 16 to the memory interconnect pads $30_0 \ldots 30_N$ allows the interconnect pads to control the memory array 16. The memory interconnect pads $30_0 \ldots 30_N$ can be coupled to the memory test equipment and the memory can be tested.

This initial testing is typically quite thorough and the defects in the memory cells are usually discovered during this initial testing. If redundant columns or rows are available in the memory, the redundant columns or rows can now be activated to replace the columns or rows containing defective cells. Extensive testing is performed on the memory to determine which if any of the memory cells are defective. The decision on whether to use a redundancy architecture is based on balancing the additional die space needed for the redundancy architecture and the yield of the manufacturing process if redundancy is not used. If the yield is high enough, it is cheaper to discard the few memories with defective cell than add the redundancy architecture to each memory. If the yield is not sufficiently high, the redundancy architecture can greatly decrease the yield loss in these memory devices by replacing a column or row containing a defect in one of its memory cells with a redundant column or row. This can save a device that would otherwise have been unusable.

The processor is also tested to ensure that it functions properly. The processor can be tested before or after the memory is tested. The processor is typically tested in the electronic wafer sort.

In the prior art the processor and embedded memory are tested in a continuous process. In the preferred embodiment of the invention, the memory is tested first on separate memory testing equipment, and a flag bit in the memory is set to a third logic state to mark that memory is non-defective or to a forth logic state to mark that the memory is defective. If the flag bit is set to the third logic state the die is tested in the electronic wafer sort.

After both the processor and the memory are tested, and typically after the integrated circuit 10 is packaged, the final test is performed on the integrated circuit 10. The memory is usually tested through the processor in the final test. The memory is tested for a much shorter time in the final test then in the initial memory test. So coupling the memory array 16 to the memory interconnect pads $30_0 \ldots 30_N$ permits the majority of the memory testing to be performed on the much less expensive memory test equipment instead of on the much more expensive processor test equipment.

Figure 2:
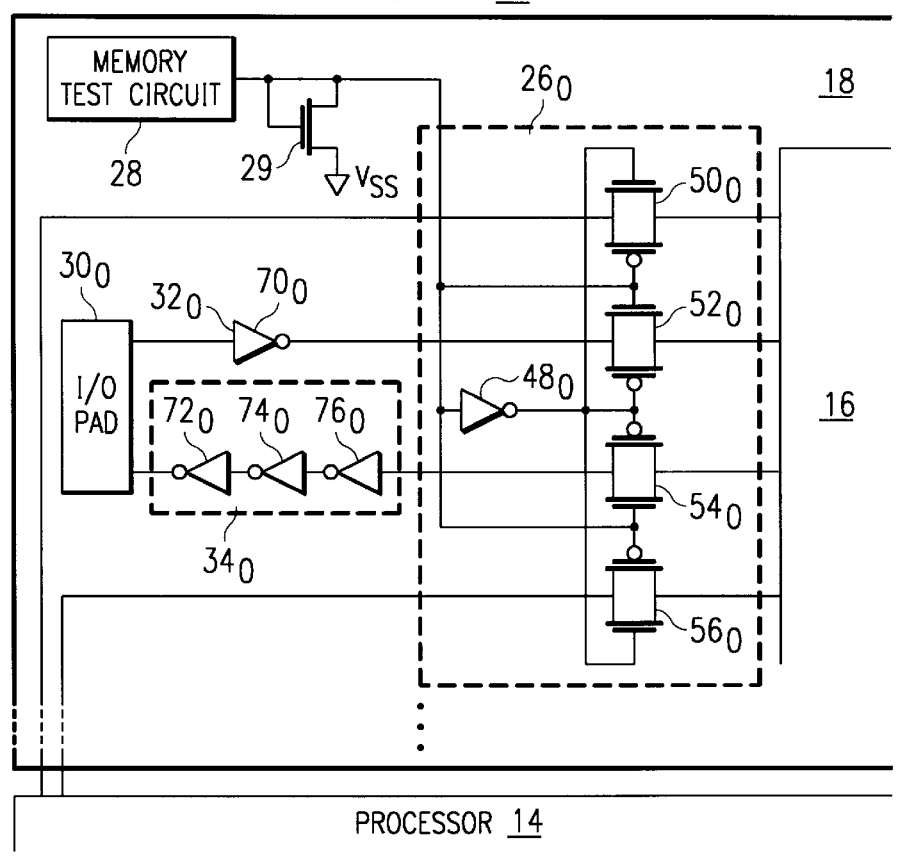
FIG. 2 is an electrical diagram, in schematic form, of the integrated circuit of FIG. 1 containing one embodiment of the switching circuit according to the present invention.

FIG. 2 shows one placement of one embodiment of the switching circuit $26_0$ coupled to the memory array 16, the processor 14, one placement of the memory interconnect pad $30_0$, one placement of the input circuit $32_0$ and one placement of the output circuit $34_0$. In the preferred embodiment of the invention input circuit $32_0$ is an inverter $70_0$ and output circuit $34_0$ is several inverters $72_0$, $74_0$, $76_0$ connected in series, although any conventional input circuit and any conventional output circuit can be used.

Figure 3:
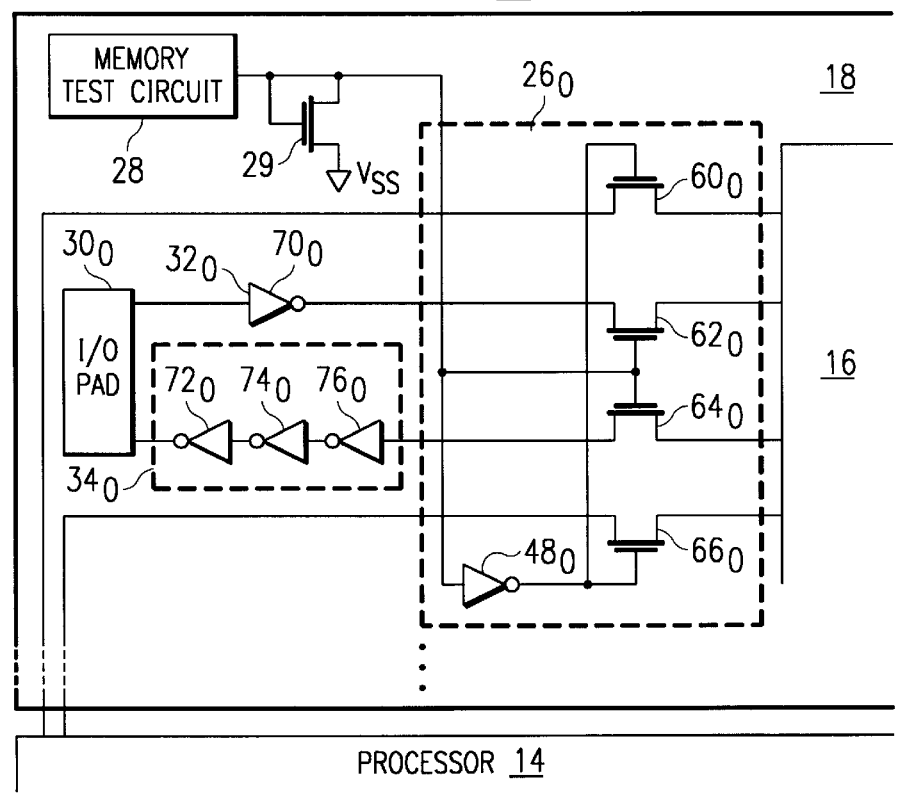
FIG. 3 is an electrical diagram, in schematic form, of the integrated circuit of FIG. 1 containing another embodiment of the switching circuit according to the present invention.

Switching circuit $26_0$ contains a first and second pair of pass elements. In one preferred embodiment of the switching circuit $26_0$ pass elements are pass gates $50_0$, $56_0$, $52_0$, $54_0$, of complementary transistors with their conduction paths connected in parallel, although any other conventional component or combination of components for passing a signal, such as a single transistor can be used. FIG. 3 shows another preferred embodiment using a single n-channel transistor as a pass element.

Referring again to FIG. 2, the first pair of pass gates $50_0$, $56_0$ are coupled between the memory array 16 and the processor 14. The second pair of pass gates $52_0$, $54_0$ are coupled between the memory array 16 and the memory interconnect pad $30_0$. The pass gates are controlled by the memory test pad 28 and inverter $48_0$ coupled to the p-channel transistors of the second pair of pass gates $52_0$, $54_0$ and to the n-channel transistors of the first pair of pass gates $50_0$, $56_0$. When the logic state on the memory test pad 28 is low, the first pair of pass gates $50_0$, $56_0$ are on, coupling the memory array 16 to the processor 14. The second pair of pass gates $52_0$, $54_0$ are off, decoupling the memory array 16 from the memory interconnect pad $30_0$. When the logic state on the memory test pad 28 is high the second pair of pass gates $52_0$, $54_0$ are on, coupling the memory array 16 to the memory interconnect pad $30_0$. The first pair of pass gates $50_0$, $56_0$ are off, decoupling the memory array 16 from the processor 14.

FIG. 3 shows one placement of another preferred embodiment of the switching circuit $26_0$ coupled to the memory array 16, the processor 14, and one placement of the memory interconnect pad $30_0$. The first and second pair of pass elements in this embodiment of the switching circuit $26_0$ are n-channel transistors $60_0$ and $66_0$, and $62_0$ and $64_0$, respectively. The first pair of transistors $60_0$, $66_0$ are coupled between the memory array 16 and the processor 14. The second pair of transistors $62_0$, $64_0$ are coupled between the memory array 16 and the memory interconnect pad $30_0$. The first pair of transistors $60_0$, $66_0$ are controlled by the memory test pad 28 and inverter $48_0$ coupling the memory array 16 to the processor 14 when the logic state on the memory test pad 28 is low and decoupling the memory array 16 from the processor 14 when the logic state on the memory test pad 28 is high. The second pair of transistors $62_0$, $64_0$ are controlled by the memory test pad 28, coupling the memory array 16 to the memory interconnect pad $30_0$ when the logic state on the memory test pad 28 is high and decoupling the memory array 16 from the memory interconnect pad $30_0$ when the logic state on the memory test pad 28 is low.

Therefore, the invention allows a standard memory to be embedded in a processor, and tested using the memory interconnect pads $30_0 \ldots 30_N$. This provides the advantages of reducing the access time of the memory and the cost of the memory by embedding a standard memory without the increased costs of fully testing the embedded memory on the more expensive processor test equipment. The embedded memory can be any conventional memory, providing the advantage that no special cost are incurred in manufacturing or design of the memory. Additionally, using a memory that has memory interconnect pads $30_0 \ldots 30_N$ also allows the embedded memory to be coupled to an external memory, permitting the combined memories to emulate a much larger memory.

This is accomplished through the above described method of temporarily coupling the memory to one or more memory interconnect pads, testing the memory, and decoupling said memory from the memory interconnect pads.

Figure 4:
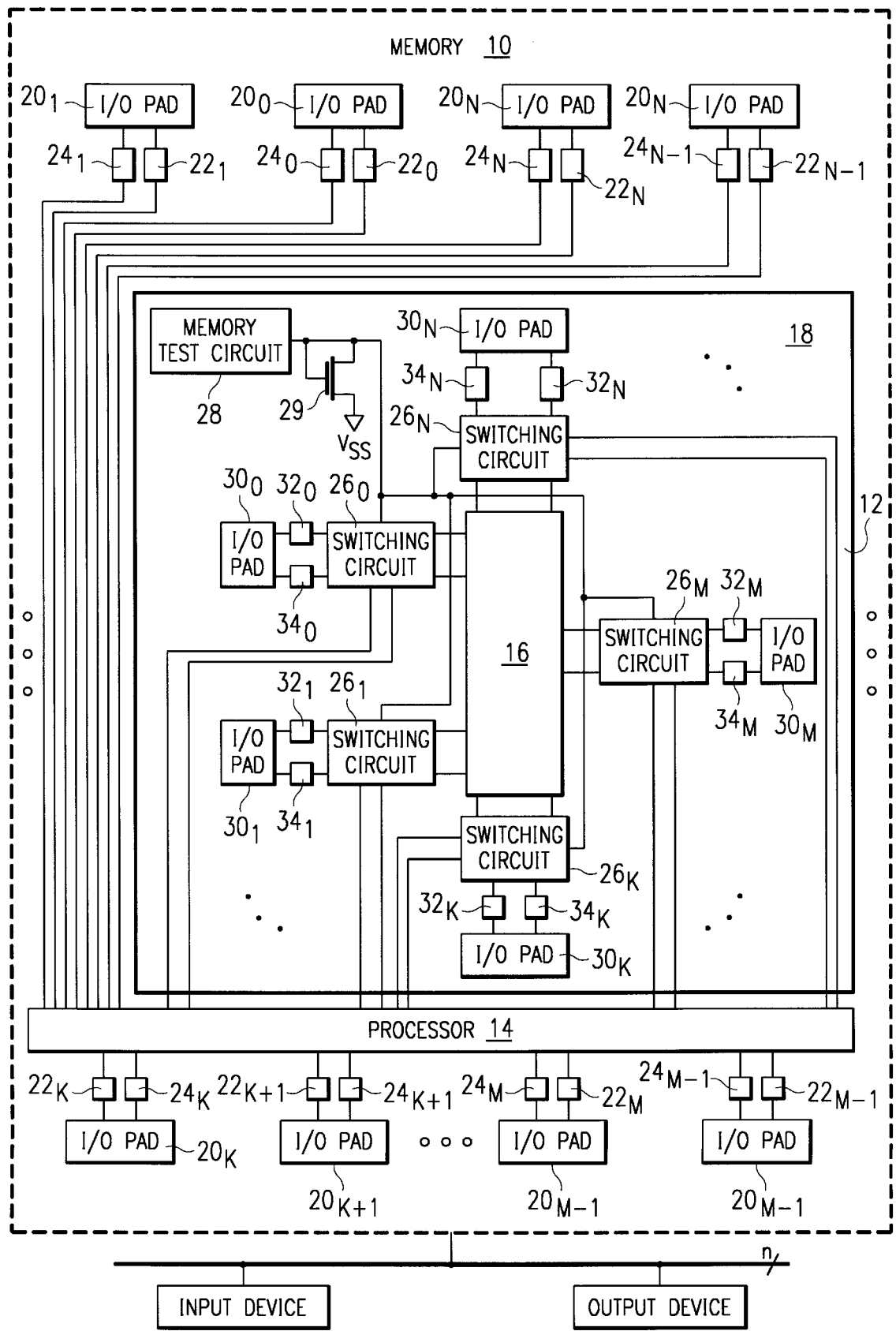
FIG. 4 is an electrical diagram, in block form, of a computer containing the integrated circuit containing embedded memory according to the present invention.

The processors with embedded memories can be used in computers, as shown in FIG. 4. This type of integrated circuit 10 is also particularly useful in medical equipment where quick access to the data stored in the memory can increase the accuracy as well as the speed of the equipment.

The invention is also useful in designing custom processors with chip cache memory. It is particularly useful in graphics devices where quicker access by the processor to the data stored in memory can improve the resolution and detail of both two and three dimensional graphics.

Further background on memories and on the testing and repairing of memories and processors can be found in: Prince, Betty, SEMICONDUCTOR MEMORIES, A HANDBOOK OF DESIGN, MANUFACTURE, AND APPLICATION, $2^{nd}$ ed., John Wiley & Sons, 1991; Zaks, Rodnay, and Alexander Wolfe, FROM CHIPS TO SYSTEMS: AN INTRODUCTION TO MICROCOMPUTERS, $2^{nd}$ ed., SYBEX, 1987; and the ISSCC proceedings from 1975 to the present, all incorporated herein by reference.

While the invention has been specifically described with reference to several preferred embodiments, it will be understood by those of ordinary skill in the prior art having reference to the current specification and drawings that various modifications may be made and various alternatives are possible therein without departing from the spirit and scope of the invention.

For example:

Although the invention is described in relation to a DRAMs or SRAMs the invention can be used in other types of memories including read-only memories, FIFOs, EPROMs, EEPROMs, or flash memories without departing from the scope of the invention.

A microprocessor, microcontroller, digital signal processor, or any application specific integrated circuit that can process data can be used as the processor without departing from the scope of the invention.

Although the invention in described using a processor any logic that can process data can be used.

While the invention has been described as particularly useful in certain application, it can be used anywhere a processor and memory are used, and is particularly useful where quick access to the data stored in the memory is desired.

Although the interconnect pads are all shown in FIG. 1 as input/output pads, some or all of the interconnect pads can be just input pads or just output pads.

While the memory interconnect pads are all shown in FIG. 1 as input/output pads, some or all of the memory interconnect pads can be just input or just output pads.

We claim:

1. An integrated circuit comprising:

a digital signal processor;

a memory having a memory array and a memory interconnect pad, with the memory array and memory interconnect pad being coupled together;

a memory test pad for receiving a first and a second logic state;

a current limiting device having a large resistance n-channel transistor with a length to width ratio of about 100 to 1 coupled to the memory test pad and ground for reducing power dissipation when the first logic state is received; and a switching circuit having a control input for receiving the logic states coupled to the current limiting device, a pair of n-channel transistors coupled to the control input and between the memory array and the processor, and an inverter with pair of p-channel transistors controlled by the inverter coupled to the control input and between the memory array and the memory interconnect pad, and with the switching circuit being responsive to the first logic state received at the control input thereof for coupling the memory array to the processor and decoupling the memory array from the memory interconnect pad and further being responsive to the second logic state received at the control input thereof for coupling the memory array to the memory interconnect pad and decoupling the memory array from the processor.

2. An integrated circuit comprising:

a digital signal processor;

a memory having a memory array and a memory interconnect pad, with the memory array and memory interconnect pad being coupled together;

a memory test pad for receiving a first and a second logic state;

a current limiting device having a large resistance n-channel transistor with a length to width ratio of about 100 to 1 coupled to the memory test pad and ground for reducing power dissipation when the first logic state is received; and a switching circuit having a control input for receiving the logic states coupled to the current limiting device, an inverter with pair of n-channel transistors controlled by the inverter coupled to the control input and between the memory array and the processor, and a pair of n-channel transistors coupled to the control input and between the memory array and the memory interconnect pad, and with the switching circuit being responsive to the first logic state received at the control input thereof for coupling the memory array to the processor and decoupling the memory array from the memory interconnect pad and further being responsive to the second logic state received at the control input thereof for coupling the memory array to the memory interconnect pad and decoupling the memory array from the processor.

* * * * *